United States Patent
Shikano et al.

(10) Patent No.: US 12,033,827 B2
(45) Date of Patent: Jul. 9, 2024

(54) PHOTOCATHODE KIT, ELECTRON GUN, AND ELECTRON BEAM APPLICATOR

(71) Applicant: Photo electron Soul Inc., Nagoya (JP)

(72) Inventors: Haruka Shikano, Nagoya (JP); Daiki Sato, Nagoya (JP); Reiki Watanabe, Nagoya (JP); Tomoaki Moriya, Nagoya (JP); Hokuto Iijima, Nagoya (JP)

(73) Assignee: Photo electron Soul Inc., Nagoya (JP)

( * ) Notice: Subject to any disclaimer, the term of this patent is extended or adjusted under 35 U.S.C. 154(b) by 334 days.

(21) Appl. No.: 17/604,368

(22) PCT Filed: Jul. 31, 2020

(86) PCT No.: PCT/JP2020/029447
§ 371 (c)(1),
(2) Date: Oct. 15, 2021

(87) PCT Pub. No.: WO2021/033519
PCT Pub. Date: Feb. 25, 2021

(65) Prior Publication Data
US 2022/0181111 A1 Jun. 9, 2022

(30) Foreign Application Priority Data
Aug. 20, 2019 (JP) .................. 2019-150764

(51) Int. Cl.
*H01J 1/34* (2006.01)
*H01J 37/073* (2006.01)
(52) U.S. Cl.
CPC .............. *H01J 1/34* (2013.01); *H01J 37/073* (2013.01)

(58) Field of Classification Search
CPC .................................. H01J 1/34; H01J 37/073
See application file for complete search history.

(56) References Cited

U.S. PATENT DOCUMENTS

| 9,934,926 B2 | 4/2018 | Nishitani |
| 2016/0172144 A1 | 6/2016 | Nishitani |
| 2021/0035766 A1 | 2/2021 | Nishitani et al. |

FOREIGN PATENT DOCUMENTS

| EP | 2270832 A1 | 1/2011 |
| JP | S 5697937 A | 8/1981 |
| JP | H 054840 A | 3/1993 |

(Continued)

OTHER PUBLICATIONS

European Extended European Search Report, dated May 19, 2022 for corresponding European application No. 20854443.7 (13 pages).

(Continued)

*Primary Examiner* — Joseph L Williams
(74) *Attorney, Agent, or Firm* — Intellectual Property Law Group LLP

(57) ABSTRACT

Provided is a photocathode kit that does not require adjustment of the distance between a photocathode film and a lens focusing on the photocathode film when the photocathode and the lens are installed inside an electron gun. The photocathode kit includes: a photocathode including a substrate in which a photocathode film is formed on a first surface; a lens; and a holder that holds the substrate and the lens, and the holder has a retaining member that retains the photocathode film and the lens to be spaced apart by a predetermined distance, and a first communication path that communicates between inside of the holder and outside of the holder.

20 Claims, 6 Drawing Sheets

(56) References Cited

FOREIGN PATENT DOCUMENTS

| JP | 2001143648 A | 5/2001 |
|---|---|---|
| JP | 2002/313273 A | 10/2002 |
| JP | 3537779 B2 | 3/2004 |
| JP | 2006119551 A | 5/2006 |
| JP | 5808021 B2 | 11/2015 |
| JP | WO 2018/186294 A1 | 6/2019 |
| WO | WO 2009/119074 A1 | 10/2009 |
| WO | WO 2015/008561 A1 | 1/2015 |

OTHER PUBLICATIONS

Lee, Hyeri et al., "A cryogenically cooled high voltage DC photoemission electron source", Review of Scientific Instruments, vol. 89, 083303, American Institute of Physics, Aug. 9, 2018, pp. 1-10.
Japan Office Action, dated Sep. 2, 2019 for corresponding Japanese Patent Application No. 2019-150764 with English translation (4 pages).
International Search Report, dated Oct. 20, 2020 for corresponding International Application No. PCT/JP2020/029447 with English translation (5 pages).
Written Opinion of the ISA, dated Oct. 20, 2020 for corresponding International Application No. PCT/JP2020/029447 with English translation (12 pages).
Office Action from Korean Intellectual Property Office (KIPO), dated Aug. 21, 2023 for corresponding Korean Patent Application No. 10-2021-7033100 with English translation (total 11 pages).
Office Action from China National Intellectual Property Administration (CNIPA), dated Jan. 13, 2024 for corresponding China Patent Application No. 202080028752.2 with English translation (total 15 pages).

PHOTOCATHODE KIT, ELECTRON GUN, AND ELECTRON BEAM APPLICATOR

CROSS-REFERENCE TO RELATED APPLICATIONS

This application is a U.S. National Phase application, under 35 U.S.C. § 371, of International Application no. PCT/JP2020/029447, with an international filing date of Jul. 31, 2020, and claims priority to Japanese application no. 2019-150764, filed on Aug. 20, 2019, each of which is hereby incorporated by reference for all purposes.

TECHNICAL FIELD

The disclosure in the present application relates to a photocathode kit, an electron gun, and an electron beam applicator.

BACKGROUND ART

Electron guns equipped with a photocathode and electron beam applicators such as an electron microscope, a free electron laser accelerator, an inspection device, or the like including such an electron gun are known. For example, Patent Literatures 1 and 2 disclose an electron gun using a photocathode irradiated with excitation light from a light source and emits an electron beam.

Patent Literature 1 discloses an electron gun using a so-called transmission type photocathode. The photocathode disclosed in Patent Literature 1 has a transparent substrate and a photocathode film formed on the surface of the transparent substrate. A light source is arranged so that light enters the transparent substrate side of the photocathode, the photocathode film is irradiated with excitation light from the light source, and electrons are emitted into vacuum from the photocathode film side. At this time, a lens is arranged between the light source and the photocathode so that the excitation light is focused on the photocathode film.

Further, Patent Literature 2 discloses an electron gun having a housing container that can accommodate a photocathode. The housing container is a container that can have a surface treatment material arranged inside to vaporize the surface treatment material and can perform EA surface treatment on the photocathode with the vaporized surface treatment material. Patent Literature 2 discloses that, with the housing container being provided, it is possible to perform EA surface treatment inside a chamber without taking the photocathode to the outside.

CITATION LIST

Patent Literature

Patent Literature 1: Japanese Patent Application Publication No. 2001-143648
Patent Literature 2: Japanese Patent No. 5808021

SUMMARY OF THE INVENTION

Technical Problem

When the light irradiation is being continued, this deteriorates electron emission characteristics of the photocathode and reduces the electron emission amount. Thus, it is known that the intensity of the electron beam of an electron beam source using a photocathode decreases with operating time. EA surface treatment is then applied to the deteriorated photocathode to recover the photocathode.

In Patent Literature 1, EA surface treatment is performed outside a vacuum chamber, and the photocathode is required to be taken out of the vacuum chamber. Since the photocathode is then arranged inside the vacuum chamber after the EA surface treatment, it is required to adjust the lens position with respect to the photocathode so that excitation light is suitably emitted to the photocathode film. Thus, there is a problem of complex operation in moving the photocathode and adjusting the lens position. Further, it is required to provide a motion mechanism used for taking the photocathode to the outside and a lens position adjustment mechanism, and this causes a problem of an increase in size and complexity of the device.

Further, when the housing container as disclosed in Patent Literature 2 is provided, the EA surface treatment of the photocathode is not required to be performed outside a vacuum chamber. However, the EA surface treatment inside a vacuum chamber causes a surface treatment material arranged inside the housing container to be vaporized, and this causes a problem of contamination of the lens when a transmission type photocathode is used.

Accordingly, in a transmission type photocathode, when the photocathode and the lens are installed inside the electron gun, the disclosure in the present application is to provide a photocathode kit, an electron gun, and an electron beam applicator equipped with the electron gun, which no adjustment of the distance between a photocathode film and a lens that focuses on the photocathode film is required. Other optional, additional advantageous effects of the disclosure in the present application will be apparent from embodiments of the invention.

Solution to Problem (1) A photocathode kit comprising:
   a photocathode including a substrate in which a photocathode film is formed on a first surface;
   a lens; and
   a holder that holds the substrate and the lens,
   wherein the holder has
   a retaining member that retains the photocathode film and the lens to be spaced apart by a predetermined distance, and
   a first communication path that communicates between inside of the holder and outside of the holder.

(2) The photocathode kit according to (1) above,
   wherein the retaining member is an internally hollowed spacer, and
   wherein the spacer
   has one end contacting with the lens,
   has the other end contacting with a second surface, which is the opposite side of the first surface, of the substrate, and
   has a second communication path that communicates between inside of the spacer and inside of the holder.

(3) The photocathode kit according to (2) above,
   wherein the spacer has a hole, and
   wherein the second communication path is the hole.

(4) The photocathode kit according to (2) above,
   wherein a recess formed in the one end and/or the other end is provided, and
   wherein the second communication path is the recess.

(5) The photocathode kit according to (1) above, wherein the retaining member has
   a lens holding part, and a substrate holding part.
(6) The photocathode kit according to any one of (1) to (5) above, wherein the holder further comprises a heater.
(7) An electron gun comprising:
   the photocathode kit according to any one of (1) to (6) above;
   a housing container configured to accommodate the photocathode kit;
   a light source configured to irradiate the photocathode with excitation light;
   an anode; and
   a vacuum chamber.
(8) The electron gun according to (7) above further comprising a surface treatment material arranged inside the housing container and used for performing surface treatment on the photocathode.
(9) An electron beam applicator comprising the electron gun according to (7) or (8), wherein the electron beam applicator is
   a free electron laser accelerator,
   an electron microscope,
   an electron holography device,
   an electron beam drawing device,
   an electron diffractometer,
   an electron beam inspection device,
   an electron beam metal additive manufacturing device,
   an electron beam lithography device,
   an electron beam processing device,
   an electron beam curing device,
   an electron beam sterilization device,
   an electron beam disinfection device,
   a plasma generation device,
   an atomic element generation device,
   a spin-polarized electron beam generation device,
   a cathodoluminescence device, or
   an inverse photoemission spectroscopy device.

Advantageous Effect of Invention

According to the disclosure in the present application, in a transmission type photocathode, no adjustment of the distance between a photocathode film and a lens that focuses on the photocathode film is required when the photocathode and the lens are installed inside the electron gun.

DESCRIPTION OF THE EMBODIMENTS

Figure 1:
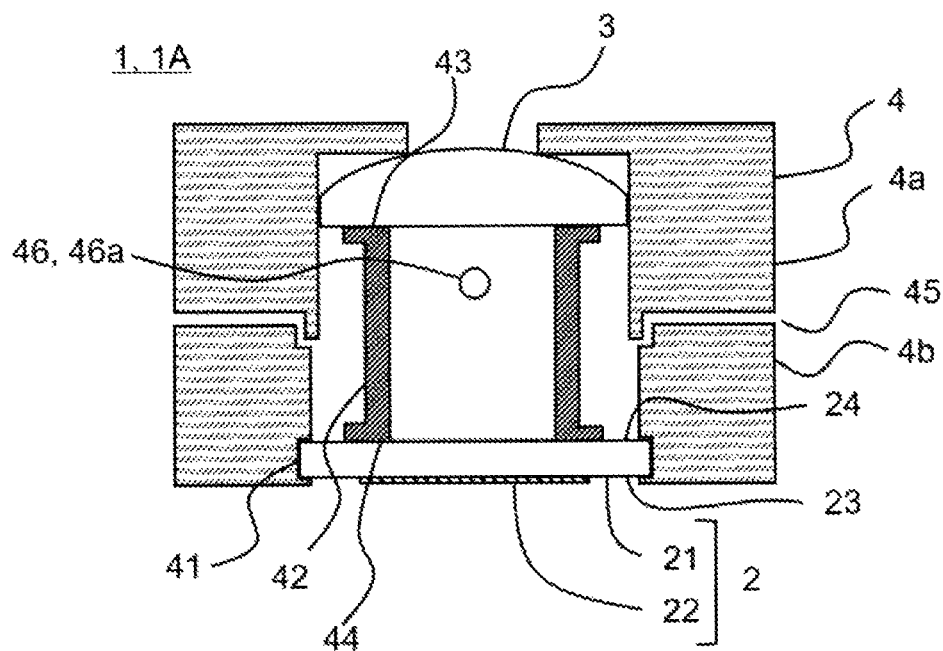
FIG. 1 is a general sectional view schematically illustrating a photocathode kit 1A in a first embodiment.

A photocathode kit, an electron gun, and an electron beam applicator will be described below in detail with reference to the drawings. Note that, in this specification, members having the same type of functions are labeled with the same or similar references. Further, for members labeled with the same or similar references, the duplicated description thereof may be omitted.

Further, the position, size, range, or the like of each feature illustrated in the drawings do not always represent the actual position, size, range, or the like for easier understanding. Thus, the disclosure in the present application is not necessarily limited to the position, size, range, or the like disclosed in the drawings.

Embodiments of Photocathode Kit 1

First Embodiment

Figure 2:
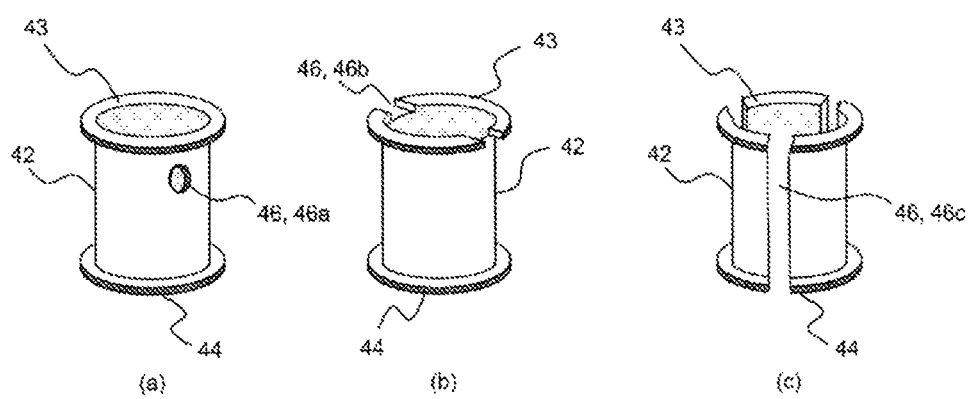
FIG. 2 represents general perspective views schematically illustrating a spacer 42 in the first embodiment.

A photocathode kit 1A in the first embodiment will be described with reference to FIG. 1 and FIG. 2. FIG. 1 is a general sectional view schematically illustrating the photocathode kit 1A in the first embodiment. FIG. 2 is a general perspective view schematically illustrating a spacer 42 that is a retaining member.

The photocathode kit 1A in the first embodiment has a photocathode 2, a lens 3, and a holder 4.

In FIG. 1, the photocathode 2 is formed of a transparent substrate 21 and a photocathode film 22 adhered to a first surface 23 of the transparent substrate 21. The photocathode 2 emits an electron beam from the photocathode film 22 in response to receiving excitation light incident from a second surface 24 side, which is opposite side to the first surface 23 on which the photocathode film 22 is formed, of the transparent substrate 21.

The transparent substrate 21 is not particularly limited as long as it can transmit excitation light received from a light source. For example, quartz glass or sapphire glass may be used.

The photocathode film 22 is not particularly limited as long as it can emit an electron beam when irradiated with excitation light and may be made of a material requiring EA surface treatment, a material not requiring EA surface treatment, or the like. The material requiring EA surface treatment may be, for example, a group III-V semiconductor material or a group II-VI semiconductor material. Specifically, AlN, $Ce_2Te$, GaN, a compound of one or more types of alkali metals and Sb, AlAs, GaP, GaAs, GaSb, InAs, or the like, and a mixed crystal thereof, or the like may be used. Another example may be a metal, specifically, Mg, Cu, Nb, $LaB_6$, $SeB_6$, Ag, or the like. With EA surface treatment being performed, the photocathode film 22 can be fabricated, and for the photocathode film 22, not only can excitation light be selected in the near-ultraviolet-infrared wavelength region in accordance with gap energy of a semiconductor but also desired electron beam source performance (quantum yield, durability, monochromaticity, time response, spin polarization) in accordance with a use of the electron beam can be achieved through selection of the material or the structure of the semiconductor.

Further, the material not requiring EA surface treatment may be, for example, a single metal, an alloy, or a metal compound of Cu, Mg, Sm, Tb, Y, or the like or diamond, WBaO, $Cs_2Te$, or the like. The photocathode film not requiring EA surface treatment can be fabricated by a known method (for example, see Japanese Patent No. 3537779 or the like).

The lens 3 converges excitation light received from a light source to the photocathode film 22. The converged excitation light is focused on the photocathode film 22, and an electron beam is emitted from the photocathode film 22. The lens 3 is not particularly limited as long as it can collect light, and a commonly used lens can be used.

The holder 4 holds the photocathode 2 and the lens 3. The holder 4 has a hollow structure so that externally incident excitation light is emitted to the photocathode 2 via the lens 3. Further, the holder 4 has, inside the hollow structure, a substrate holding part 41 that holds the transparent substrate 21 of the photocathode 2 and a retaining member 42 by which the photocathode film 22 and the lens 3 are spaced apart by a predetermined distance. FIG. 1 illustrates an example using a spacer 42 as the retaining member 42.

Note that, although the lens 3 is interposed between and held by the holder 4 and the spacer 42 in the example illustrated in FIG. 1, the lens 3 and the spacer 42 can be fixed by a screw. When the lens 3 and the spacer 42 are fixed by a screw, there may be a space between the convex surface of the lens 3 and the holder 4.

While details will be described later, the holder 4 can have a heater and thus be preferably formed of a material with good heat transfer. The material may be, for example, a metal such as titanium, molybdenum, an alloy thereof, Inconel, stainless steel (SUS), or the like.

The substrate holding part 41 is not particularly limited as long as it can hold (fix) the transparent substrate 21 to the holder 4. FIG. 1 illustrates the example in which a recess that accepts the end of the transparent substrate 21 is formed in the holder 4. Alternatively, a protrusion may be formed on the holder 4, and the protrusion and a recess formed in the transparent substrate 21 may be engaged with each other.

The spacer 42 is arranged between the photocathode 2 and the lens 3 and defines the distance between the photocathode 2 and the lens 3, in other words, the positional relationship between the photocathode 2 and the lens 3 so that the focal point of the lens 3 is located on the photocathode film 22. The spacer 42 illustrated in FIG. 1 as an example has an internally hollowed cylindrical shape. Further, one end 43 of the spacer 42 is in contact with the lens 3, and the other end 44 is in contact with a second surface 24 (the surface opposite side to the first surface 23 formed with the photocathode film 22) of the transparent substrate 21 forming the photocathode 2. Note that, although the spacer 42 illustrated in FIG. 1 as an example has flanges formed to the hollow cylinder ends (43, 44) so that the contact areas with the lens 3 and the transparent substrate 21 are increased, the formation of the flanges is not essential, and no flange may be formed.

The material forming the spacer 42 is not particularly limited as long as it can retain the photocathode film 22 and the lens 3 to be spaced apart by a predetermined distance. For example, the spacer 42 may be formed of a metal or the like similarly to the holder 4. Alternatively, the spacer 42 may be formed of a non-metal material such as synthetic quartz or ceramics. The non-metal material such as synthetic quartz or ceramics is less deformed by heating than a metal or the like. Therefore, if the non-metal material such as synthetic quartz or ceramics is used as the material forming the spacer, this achieves an advantageous effect that the distance between the photocathode film 22 and the lens 3 is less likely to be changed.

The photocathode kit 1A illustrated in FIG. 1 as an example is arranged inside a vacuum chamber of an electron gun, and the inside of the holder 4 has a hollow structure. When the photocathode 2 and the lens 3 are held and thereby the inside of the holder 4 is in an airtight state, a gas inside the hollow structure expands in vacuum, and this may affect the distance between the photocathode film 22 and the lens 3. Thus, to prevent expansion of the gas inside the holder 4 in vacuum, the holder 4 has a gas vent 45 (first communication path) communicating between the inside and the outside of the holder 4. The first communication path 45 may be, for example, a through hole communicating between the inside and the outside of the holder 4. In the example illustrated in FIG. 1, the holder 4 is formed of a holder first member 4a and a holder second member 4b and formed such that, when the holder first member 4a and the holder second member 4b are in engagement, a gap (first communication path 45) occurs in the engaged portion. Alternatively, although not illustrated, a through hole (first communication path 45) may be formed in advance in a portion other than the engaged portion of the holder first member 4a and/or the holder second member 4b, the engaged portions of the holder first member 4a and the holder second member 4b may be formed of an external thread and an internal thread, for example, and thereby a gap may not be positively generated in the engaged portion.

Further, in the example illustrated in FIG. 1, the transparent substrate 21 is held in a recess (the substrate holding part 41) formed in the holder second member 4b. Therefore, to insert the end of the transparent substrate 21 in the substrate holding part 41, the holder second member 4b may be formed so as to be dividable into a plurality of members. Further, FIG. 1 illustrates an example in which the holder first member 4a and the holder second member 4b are divided in the vertical direction of FIG. 1. Alternatively, the holder first member 4a and the holder second member 4b may be able to be divided in the horizontal direction of FIG. 1.

Further, since the spacer 42 illustrated in FIG. 1 as an example has an internally hollowed cylindrical shape, when the ends (43, 44) of the spacer 42 come into contact with the lens 3 and the transparent substrate 21, respectively, the inside of the spacer 42 becomes airtight. Therefore, similarly to the holder 4, the spacer 42 has a second communication path 46 communicating between the inside and the outside (inside the holder 4) of the spacer 42.

The second communication path 46 of the spacer 42 illustrated in FIG. 1 as an example is a hole 46a formed in a cylindrical portion of the spacer 42 and communicating between the inside and the outside of the cylindrical portion. FIG. 2(a) is a perspective view illustrating the overview of the spacer 42 illustrated as an example in FIG. 1. Note that the second communication path 46 is not limited to the example illustrated in FIG. 1 and FIG. 2(a) as long as the inside of the spacer 42 does not become airtight. FIG. 2(b) is a perspective view illustrating another embodiment of the second communication path 46 and illustrates an example provided with a recess 46b, which is a cutout, in the one end 43 of the spacer 42. Further, the second communication path 46 may be any path that can cause the inside of the spacer 42 and the inside of the holder 4 to communicate with each other, and a recess may be provided in the other end 44. Alternatively, the hole 46a and the recess 46b may be combined. Further, although FIG. 1 and FIGS. 2(a) and (b) illustrate the example in which the shape of the spacer 42 is cylindrical, the shape of the spacer 42 is not particularly limited as long as it can retain the lens 3 and the photocathode film 22 to be spaced apart by a predetermined distance. For example, as illustrated in FIG. 2(c), the spacer 42 may be formed of a plurality of divided members. In the example illustrated in FIG. 2(c), each gap 46c between adjacent spacers 42 forms the second communication path 46.

The photocathode kit 1A in the first embodiment holds the transparent substrate 21 and the lens 3 so that the focal point of the lens 3 is located on the photocathode film 22 of the photocathode 2. Therefore, with the photocathode kit 1A being installed on a light path from a light source, the focal point of excitation light that has passed through the lens 3 can be located on the photocathode film 22. In the conventional art, adjustment for matching the focal point of the lens 3 to the photocathode film 22 is required every time the photocathode 2 is installed inside an electron gun. On the other hand, the use of the photocathode kit 1A illustrated in the first embodiment eliminates the need for position adjustment of the lens 3, and this achieves an advantageous effect that an operation of installing the photocathode 2 and the lens 3 inside the electron gun is simplified.

Further, in the conventional art, two drive units of a drive unit that moves the photocathode and a drive unit that moves the lens are required when the photocathode is installed inside an electron gun. On the other hand, the use of the photocathode kit 1A illustrated in the first embodiment eliminates the need for position adjustment of the lens 3. Thus, the position of the photocathode 2 installed in the electron gun can be adjusted by using only the drive unit which moves the photocathode kit 1A, and this achieves an advantageous effect that the device can be reduced in size and simplified.

Second Embodiment

Figure 3:
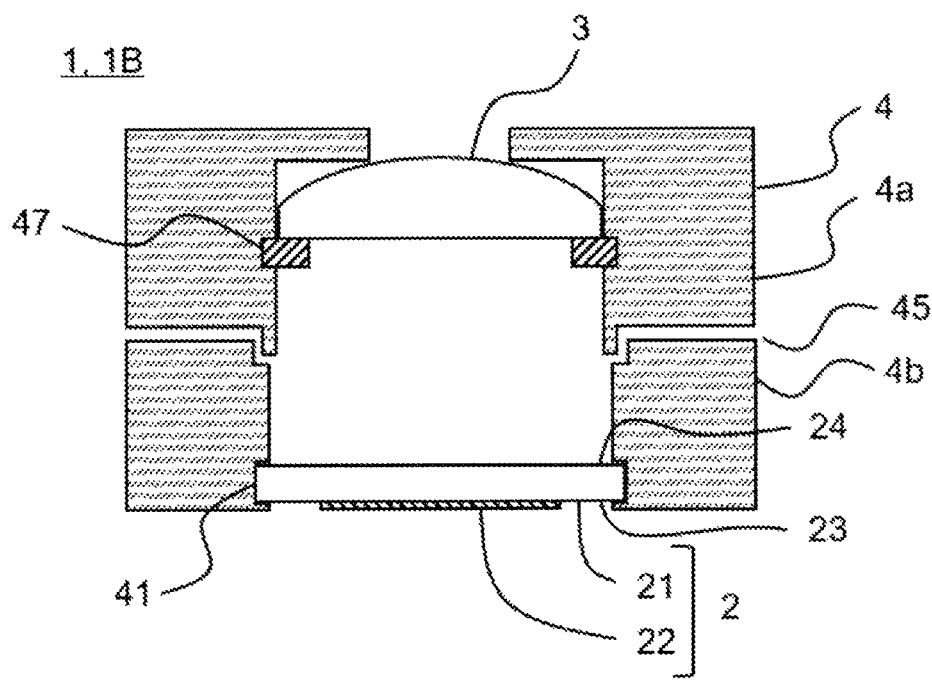
FIG. 3 is a general sectional view schematically illustrating a photocathode kit 1B in a second embodiment.

A photocathode kit 1B in the second embodiment will be described with reference to FIG. 3. FIG. 3 is a general sectional view schematically illustrating an example of the photocathode kit 1B in the second embodiment.

In the first embodiment, the spacer 42 is used as a retaining member for maintaining the distance between the photocathode film 22 and the lens 3 to be a predetermined distance. On the other hand, the second embodiment differs from the first embodiment in that, instead of the spacer 42, a lens holding part is used as the retaining member. Therefore, in the second embodiment, features different from those of the first embodiment will be mainly described, and duplicated description for the features already described in the first embodiment will be omitted. Thus, needless to say, the feature already described in the first embodiment can be employed in the second embodiment even when not explicitly described in the second embodiment.

The holder 4 in the second embodiment illustrated in FIG. 3 as an example has a substrate holding part 41, which holds the transparent substrate 21 of the photocathode 2, and a lens holding part 47. Further, the distance between the photocathode film 22 and the lens 3 is maintained to be a predetermined distance by the substrate holding part 41 and the lens holding part 47.

The lens holding part 47 is not particularly limited as long as it can fix and hold the lens 3 inside the holder 4 without contacting with the transparent substrate 21. The lens holding part 47 illustrated in FIG. 3 as an example is substantially an annular member formed of a separate component from the holder 4. In the example illustrated in FIG. 3, the outer edge portion of the lens holding part 47 engages with a recess formed in the holder first member 4a, and the inner edge portion of the lens holding part 47 protrudes inside the holder 4. Therefore, the lens 3 can be held by the portion protruding inside the holder 4. Note that the lens holding part 47 may be formed of a plurality of members instead of substantially an annular member. When the lens holding part 47 is formed of a plurality of members, the number of members is not limited as long as one end of each of the members engages with the recess formed in the holder first member 4a, the other end of each of the members protrudes inside the holder 4, and thereby the lens 3 can be held.

Further, although depiction is omitted, the lens holding part 47 may be formed integrally with the holder 4. More specifically, similarly to the substrate holding part 41, the lens holding part 47 may be formed as a recess provided in the holder 4, and the lens 3 may be engaged with the recess. Alternatively, the lens holding part 47 may be formed as a protrusion provided integrally with the holder 4. The holder 4, as described in the first embodiment, may be divided if necessary.

When the lens holding part 47 and the holder 4 are formed as separate components, the lens holding part 47 may be formed of a metal or a non-metal material such as ceramics similar to the holder 4, for example.

In the second embodiment, the photocathode film 22 and the lens 3 can be retained to be spaced apart by a predetermined distance by the substrate holding part 41 and the lens holding part 47. Therefore, also in the second embodiment, the same advantageous effects as achieved by the photocathode kit 1A of the first embodiment can be achieved.

Third Embodiment

Figure 4A:
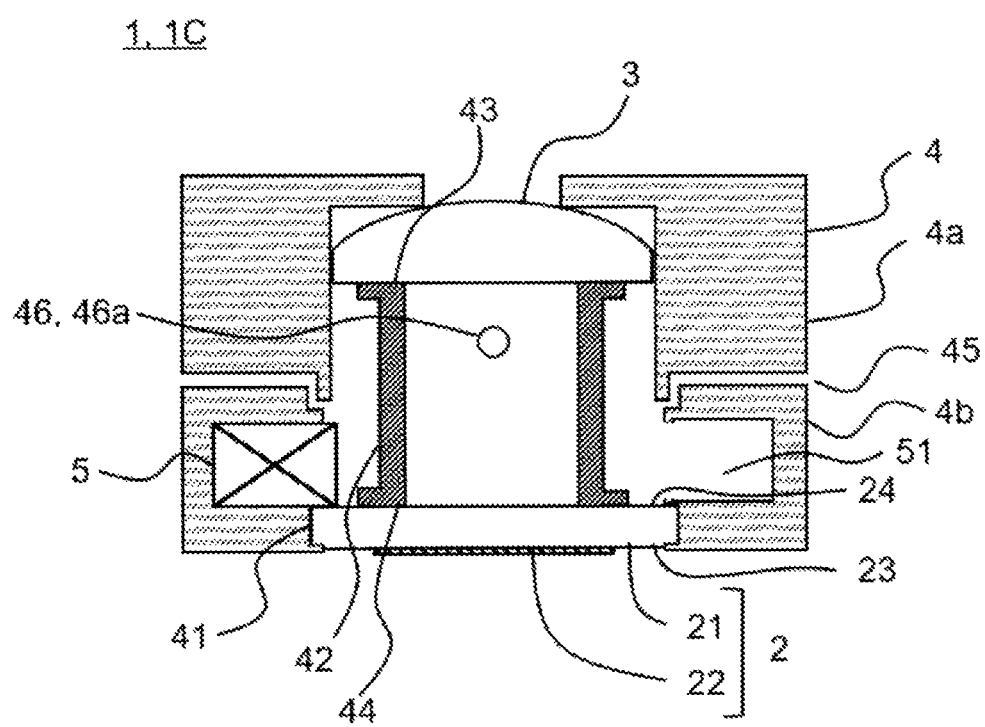
FIG. 4A is a general sectional view schematically illustrating a photocathode kit 1C in a third embodiment.
Figure 4B:
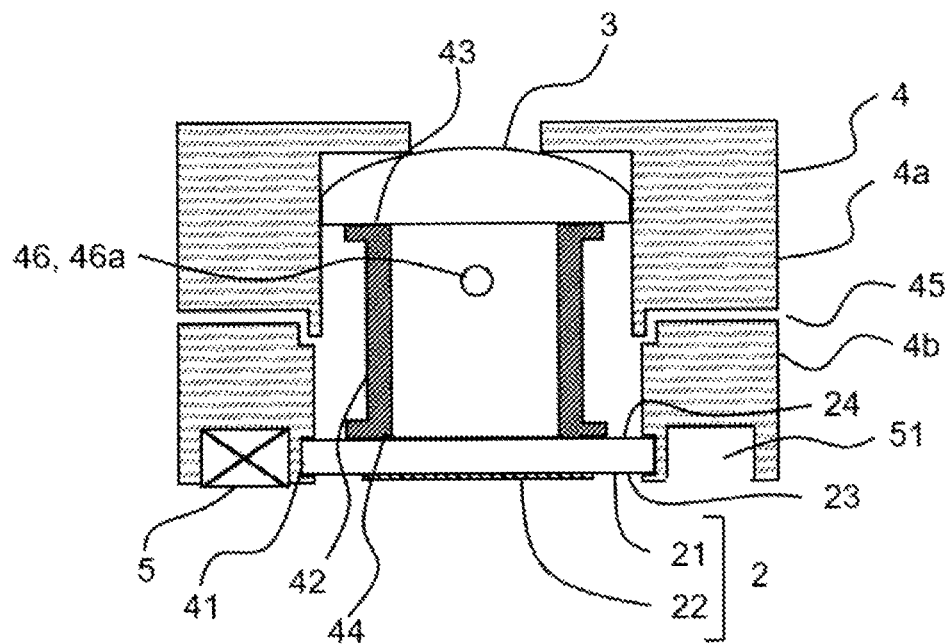
FIG. 4B is a general sectional view schematically illustrating the photocathode kit 1C in the third embodiment.
Figure 4C:
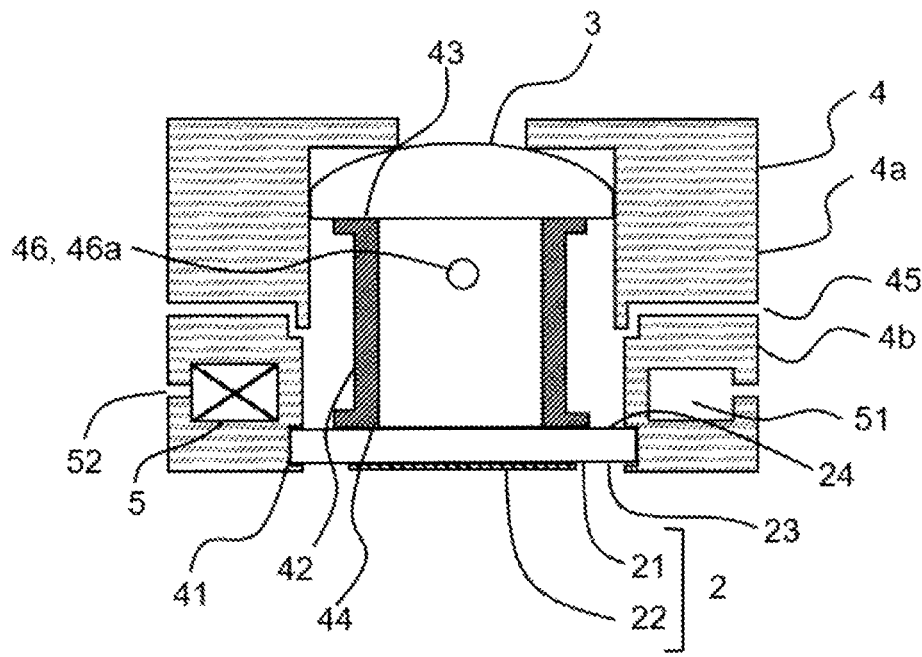
FIG. 4C is a general sectional view schematically illustrating the photocathode kit 1C in the third embodiment.

A photocathode kit 1C in the third embodiment will be described with reference to FIGS. 4A to 4C. FIGS. 4A to 4C are general sectional views schematically illustrating an example of the photocathode kit 1C in the third embodiment.

The photocathode kit 1C in the third embodiment differs from the photocathode kit 1A illustrated in the first embodiment in that a heater 5 is further provided, and other features are the same as those of the first embodiment. Therefore, in the third embodiment, features different from those of the first embodiment will be mainly described, and duplicated description for the features already described in the first embodiment will be omitted. Thus, needless to say, the feature already described in the first embodiment can be employed in the third embodiment even when not explicitly described in the third embodiment. Further, although the examples illustrated in FIGS. 4A to 4C will be described with reference to the first embodiment, needless to say, the feature already described in the second embodiment can be employed in the third embodiment.

Before the photocathode 2 is installed in the electron gun, the photocathode 2 is exposed to impurities in the atmospheric air. It is thus necessary to clean up the surface of the photocathode 2 by heating at 300 to 700 degrees Celsius in vacuum for 10 minutes to 1 hour and removing surface impurities such as an oxide or a carbide.

In the third embodiment, the photocathode kit 1C has the heater 5. It is thus possible to heat the photocathode 2 by using the configuration provided to the photocathode kit 1C. In the example illustrated in FIG. 4A, the heater 5 is provided so as to be inserted in a heater insertion space 51 facing the hollow space of the holder 4. In the example illustrated in FIG. 4A, since the heater 5 is arranged so as to be in contact with the transparent substrate 21, the transparent substrate 21 can be directly heated. Alternatively, the heater 5 may be arranged not in contact with the transparent substrate 21, and the transparent substrate 21 may be heated via the holder 4. FIG. 4B and FIG. 4C are general sectional views illustrating other embodiments of the arrangement of the heater 5. As illustrated in FIG. 4B, the heater 5 may be arranged in the heater insertion space 51 provided outside the holder 4. In the example illustrated in FIG. 4B, even when the heater 5 fails, easy replacement is possible. Further, as illustrated in FIG. 4B, the heater 5 can be attached afterward.

In the example illustrated in FIG. 4C, the heater 5 is arranged in the heater insertion space 51 provided inside the holder 4. When the heater 5 is heated, a gas may occur from the material forming the heater 5. Then, if the generated gas flows into the holder 4, this may contaminate the second surface 24 of the photocathode 2 and the lens 3. In the example illustrated in FIG. 4C, a second gas vent 52 communicating between the heater insertion space 51 and the outside of the holder 4 is provided in the holder 4. It is thus possible to prevent a gas generated from the heater 5 from flowing into the holder 4. The second gas vent 52 may be, for example, a through hole communicating between the inside and the outside of the holder 4.

Further, the photocathode kit 1 is arranged inside the electron gun and can perform EA surface treatment on the photocathode 2 inside the electron gun. The EA surface treatment is performed by vaporizing and depositing a surface treatment material on the photocathode 2. In this process, if the heater 5 is exposed to the outside of the holder 4, the surface treatment material of the photocathode 2 may deposit to the heater 5. In the example illustrated in FIG. 4C, by arranging the heater 5 inside the holder 4, it is possible to suppress the surface treatment material from depositing to the heater 5. Needless to say, the heater insertion space 51 may be formed in the holder 4 illustrated in the first and second embodiment.

The heater 5 is not particularly limited as long as it can heat the photocathode film 22 to around 300 to 700 degrees Celsius in vacuum. The heater 5 may be, for example, a heating wire of tantalum or the like or a laser heating device.

The photocathode kit 1C in the third embodiment synergistically achieves the following advantageous effects in addition to the advantageous effects achieved by the photocathode kit 1 of the first and second embodiments.

It is possible to perform heat treatment on the photocathode 2 inside an electron gun after the photocathode kit 1C is installed in the electron gun. Further, even when the photocathode 2 is deteriorated by attachment of impurities due to usage, it is possible to perform heat treatment on the photocathode 2 without taking the electron gun to the outside.

Fourth Embodiment

Figure 5:
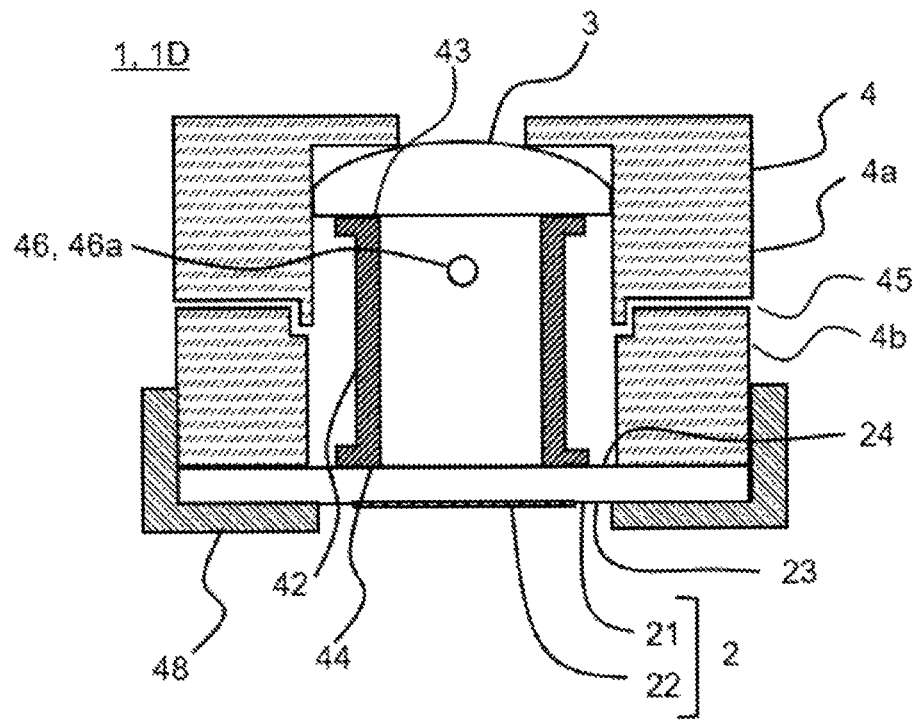
FIG. 5 is a general sectional view schematically illustrating a photocathode kit 1D in a fourth embodiment.

A photocathode kit 1D in the fourth embodiment will be described with reference to FIG. 5. FIG. 5 is a general sectional view schematically illustrating an example of the photocathode kit 1D in the fourth embodiment.

In the first embodiment, the substrate holding part 41 is provided to the holder 4 to hold the transparent substrate 21. On the other hand, the fourth embodiment differs from the first embodiment in that the transparent substrate 21 is held by a substrate holding member 48 instead of being held by the substrate holding part 41, and other features are the same as those of the first embodiment. Therefore, in the fourth embodiment, features different from those of the first embodiment will be mainly described, and duplicated description for the features already described in the first embodiment will be omitted. Thus, needless to say, the feature already described in the first embodiment can be employed in the fourth embodiment even when not explicitly described in the fourth embodiment. Further, although the example illustrated in FIG. 5 will be described with reference to the first embodiment, needless to say, the feature already described in the second and third embodiments can be employed in the fourth embodiment.

In the example illustrated in FIG. 5, the transparent substrate 21 is held by the holder 4 by using the substrate holding member 48 at the lower end of the holder 4. Further, the transparent substrate 21 is held by the holder 4, and the distance between the photocathode film 22 and the lens 3 is maintained to be a predetermined distance via the spacer 42.

The substrate holding member 48 is not particularly limited as long as it can hold the transparent substrate 21 at the lower end of the holder 4. The substrate holding member 48 illustrated in FIG. 5 is substantially an annular member having substantially an L-shaped cross section formed of a separate component from the holder 4. In the example illustrated in FIG. 5, the transparent substrate 21 is interposed between and held by the lower end of the holder 4 and the substrate holding member 48, the holder 4 and the substrate holding member 48 are engaged with each other, and thereby, the transparent substrate 21 is held in the holder 4. The engagement scheme between the holder 4 and the substrate holding member 48 is not particularly limited, and a known scheme such as fixing by using a screw, fixing by using an engagement groove, or the like can be used.

The substrate holding member 48 can be formed of a metal or a non-metal material such as ceramics similar to the holder 4, for example.

The photocathode kit 1D in the fourth embodiment synergistically achieves the following advantageous effects in addition to the advantageous effects achieved by the photocathode kit 1 of the first to third embodiments.

When the transparent substrate 21 is held inside the holder 4 as with the first embodiment, the holder 4 is required to be formed of a plurality of members. On the other hand, in the fourth embodiment, since the transparent substrate 21 can be held from the outside of the holder 4, the holder 4 can be formed of a single cylindrical component.

Further, when the transparent substrate 21 is held inside the holder 4, handling of the transparent substrate 21 will be difficult unless the transparent substrate 21 has a certain thickness. On the other hand, in the fourth embodiment, since the transparent substrate 21 can be arranged between the lower end of the holder 4 and the substrate holding member 48 and held by the holder 4, the transparent substrate 21 can be thinner. With the thinner transparent substrate 21, a loss of light with which the photocathode film 22 is irradiated is suppressed, and this enables efficient emission of an electron beam. Further, since the thermal capacity of the transparent substrate 21 is reduced, the surface of the photocathode 2 can be efficiently cleaned up.

Fifth Embodiment

Figure 6A:
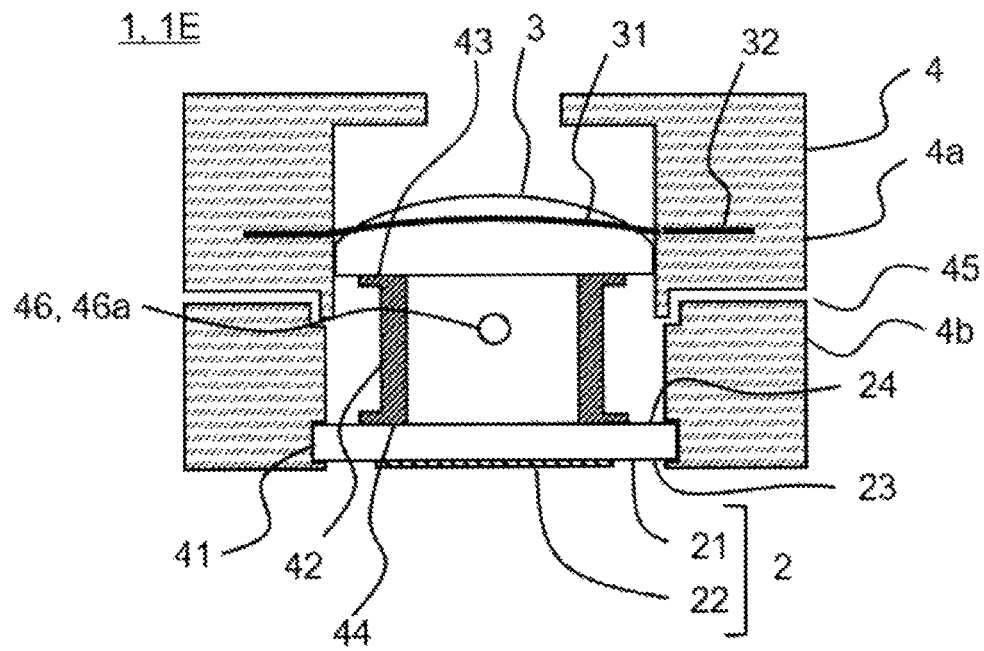
FIG. 6A is a general sectional view schematically illustrating a photocathode kit 1E in a fifth embodiment.

A photocathode kit 1E in the fifth embodiment will be described with reference to FIG. 6A and FIG. 6B. FIG. 6A is a general sectional view schematically illustrating an example of the photocathode kit 1E in the fifth embodiment, and FIG. 6B is a general perspective view schematically illustrating a lens fixing method using a lens pressing member 31.

In the first embodiment, the lens 3 is interposed between and held by the holder 4 and the spacer 42 to hold the lens 3 in the holder 4. On the other hand, the fifth embodiment differs from the first embodiment in that the lens 3 is held by the lens pressing member 31 and the spacer 42 instead of being held by the holder 4 and the spacer 42, and other features are the same as those of the first embodiment. Therefore, in the fifth embodiment, features different from those of the first embodiment will be mainly described, and duplicated description for the features already described in the first embodiment will be omitted. Thus, needless to say, the feature already described in the first embodiment can be employed in the fifth embodiment even when not explicitly described in the fifth embodiment. Further, although the example illustrated in FIG. 6 will be described with reference to the first embodiment, needless to say, the feature already described in the second to fourth embodiments can be employed in the fifth embodiment.

Figure 6B:
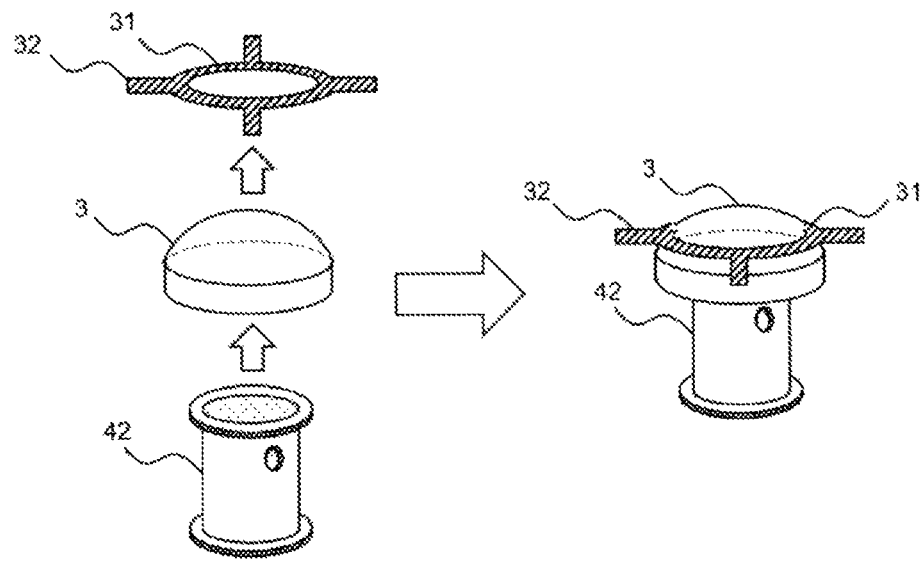
FIG. 6B is a general perspective view schematically illustrating a lens fixing method using a lens pressing member in the fifth embodiment.

The lens 3 in the fifth embodiment is interposed between and held by the lens pressing member 31 and the spacer 42 as illustrated in FIG. 6B. Further, the lens 3 is held inside the holder 4 by the spacer 42 and the lens pressing member 31 (FIG. 6A). As a result, the distance between the photocathode film 22 and the lens 3 is maintained to be a predetermined distance.

The lens pressing member 31 is not particularly limited as long as it can press the lens against the spacer 42 without interfering the light path of excitation light emitted to the photocathode film 22. The lens pressing member 31 illustrated in FIG. 6B is an elastic plate-like member (plate spring) formed of a separate component from the holder 4. Further, the lens pressing member 31 has a fixing part 32 fixed to the holder 4. The way to fix the lens pressing member 31 is not particularly limited as long as the lens pressing member 31 can be fixed to the holder 4. For example, a recess may be formed in the holder 4, and the fixing part 32 may be engaged with and fixed to the recess, or the holder 4 may be divided, and the fixing part 32 is interposed therebetween and fixed by a screw. The lens pressing member 31 illustrated in FIG. 6B as an example does not block the light path of excitation light because the portion in contact with the lens 3 is annular. Since the lens pressing member 31 is elastic, the lens 3 can be pressed against the spacer 42 when the lens 3 is held in the holder 4. Note that the lens pressing member 31 may be formed of a plurality of members. When the lens pressing member 31 is formed of a plurality of members, one end of each of the members is engaged with the holder 4, the other end of each of the members is protruded into the holder 4, and the other end can be held in contact with the lens 3. When the lens pressing member 31 is formed of a plurality of members, the number of members is not limited as long as the lens 3 can be pressed against the spacer 42.

The material forming the lens pressing member 31 is not particularly limited as long as it is elastic. The material may be, for example, a metal or the like similar to the holder 4. Note that, as described above, when heat treatment of the photocathode 2 is performed, since the temperature thereof is elevated to around 300 to 700 degrees Celsius in vacuum, the temperature of the lens pressing member 31 is also elevated. Since the lens pressing member 31 is used for maintaining the distance between the lens 3 and the photocathode film 22 to be a predetermined distance, it is more preferable that the material forming the lens pressing member 31 be sufficiently heat-resistant, have small thermal expansion, and less emitting a gas when heated. In terms of the above, as the material forming the lens pressing member 31, titanium is most preferred, and molybdenum or Inconel is next most preferred. The material forming the lens pressing member 31 and the material forming the holder 4 may be the same or may be different from each other.

The photocathode kit 1E in the fifth embodiment synergistically achieves the following advantageous effects in addition to the advantageous effects achieved by the photocathode kit 1 of the first to fourth embodiments.

When heat treatment on the photocathode 2 or EA surface treatment on the photocathode 2 is performed, the photocathode kit 1 is heated. In this process, the holder 4 is distorted due to influence of heat, and the distortion may affect the distance between the photocathode film 22 and the lens 3. In the fifth embodiment illustrated in FIG. 6 as an example, even when the holder 4 is distorted due to heat, since the lens pressing member 31 presses the lens 3 against the spacer 42, this enables a state where the distance between the photocathode film 22 and the lens 3 is always maintained by the spacer 42.

Sixth Embodiment

Figure 7:
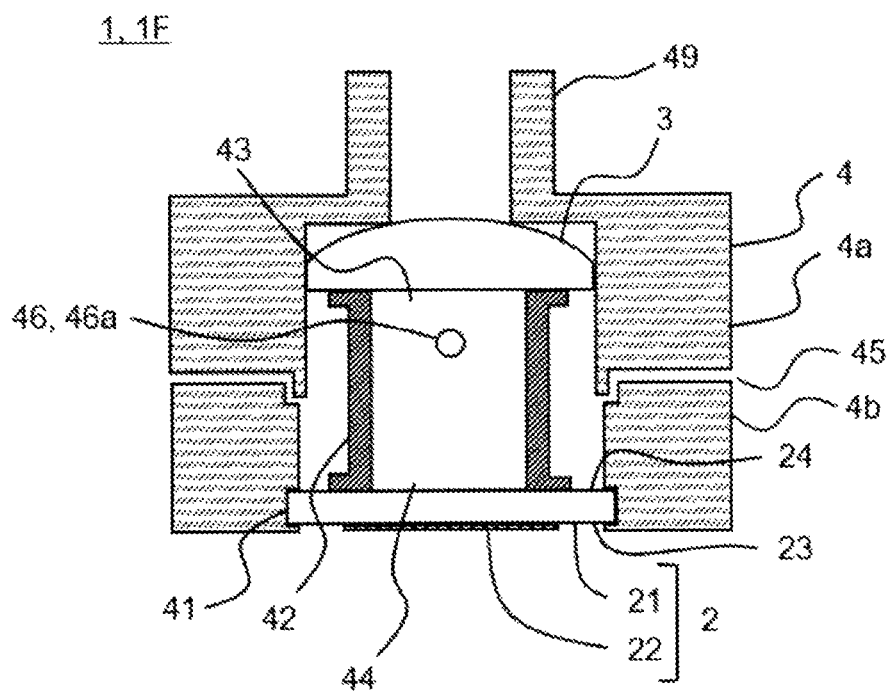
FIG. 7 is a general sectional view schematically illustrating a photocathode kit 1F in a sixth embodiment.

A photocathode kit 1F in the sixth embodiment will be described with reference to FIG. 7. FIG. 7 is a general sectional view schematically illustrating an example of the photocathode kit 1F in the sixth embodiment.

The sixth embodiment differs from the first embodiment in that a vapor-inflow prevention part 49 is provided on the upper end side of the holder 4, and other features are the same as those of the first embodiment. Therefore, in the sixth embodiment, features different from those of the first embodiment will be mainly described, and duplicated description for the features already described in the first embodiment will be omitted. Thus, needless to say, the feature already described in the first embodiment can be employed in the sixth embodiment even when not explicitly described in the sixth embodiment. Further, although the example illustrated in FIG. 7 will be described with reference to the first embodiment, needless to say, the feature already described in the second to fifth embodiments can be employed in the sixth embodiment.

Although details will be described later, the photocathode kit 1 is arranged inside an electron gun and can perform EA surface treatment on the photocathode 2 inside the electron gun. The EA surface treatment is performed by vaporizing and depositing a surface treatment material on the photocathode 2.

While most of the vaporized surface treatment material reaches the lower end side of the photocathode kit 1, a part of the vaporized surface treatment material may reach the upper end side of the photocathode kit 1. The sixth embodiment illustrated in FIG. 7 as an example is such that the vapor-inflow prevention part 49 that prevents the lens 3 from being contaminated by a surface treatment material reaching the upper end side of the photocathode kit 1 when EA surface treatment on the photocathode 2 is performed inside the electron gun is provided on the upper end of the holder 4.

The vapor-inflow prevention part 49 is not particularly limited as long as the vaporized surface treatment material is less likely to deposit to the upper surface of the lens 3. In the example illustrated in FIG. 7, the vapor-inflow prevention part 49 is formed of a hollow cylindrical member through which excitation light L can pass. The vapor-inflow prevention part 49 may be formed integrally with the holder 4. Alternatively, the vapor-inflow prevention part 49 may be formed as a separate component from the holder 4 and attached to the holder 4.

The photocathode kit 1F in the sixth embodiment synergistically achieves the following advantageous effects in addition to the advantageous effects achieved by the photocathode kit 1 of the first to fifth embodiments.

With the vapor-inflow prevention part 49 being provided, the lens 3 can be kept cleaner.

Embodiment of Electron Gun

First Embodiment

Figure 8:
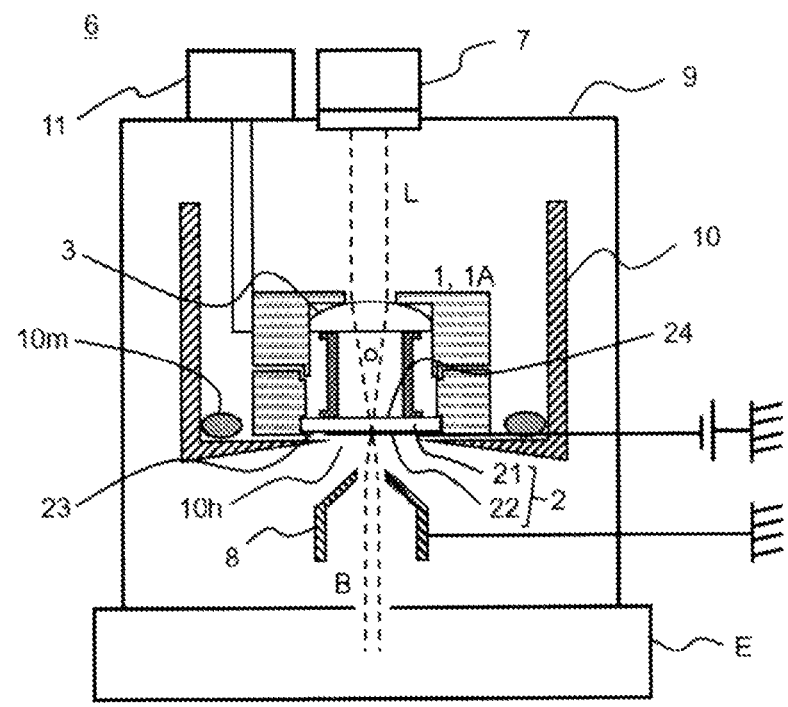
FIG. 8 is a general sectional view schematically illustrating an electron gun 6 and a device equipped with the electron gun 6 in the first embodiment.
Figure 9:
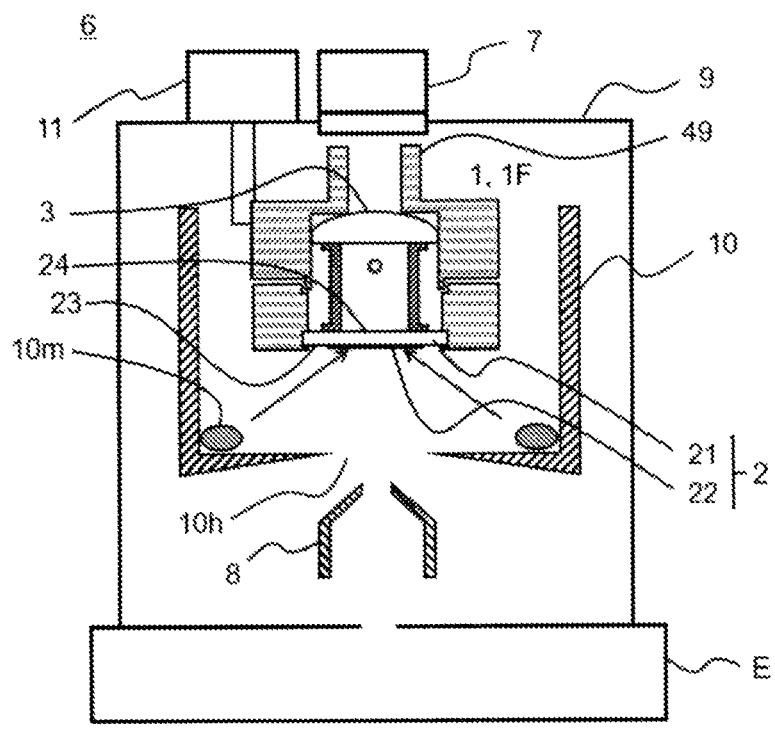
FIG. 9 is a general sectional view schematically illustrating EA surface treatment of the electron gun 6 in the first embodiment.

A first embodiment of an electron gun 6 having the photocathode kit 1 will be described with reference to FIG. and FIG. 9. FIG. 8 is a general sectional view schematically illustrating the electron gun 6 in the first embodiment and a counterpart device E equipped with the electron gun 6. FIG. 9 is a general sectional view schematically illustrating an example of EA surface treatment on the photocathode 2 inside the electron gun.

The electron gun 6 in the first embodiment has the photocathode kit 1, a light source 7, an anode 8, a vacuum chamber 9, and a housing container 10 that can accommodate the photocathode kit 1.

Further, the photocathode kit 1 illustrated in FIG. 8 as an example is arranged inside the housing container 10 having an electron beam passage hole 10h. A surface treatment material 10m for performing EA surface treatment (in other words, treatment to reduce electron affinity) on the photocathode 2 is arranged inside the housing container 10.

The light source 7 is not particularly limited as long as it can irradiate the photocathode 2 with the excitation light L to emit an electron beam B. The light source 7 may be, for example, a high power (watt order) and high frequency (several hundred MHz) ultrashort pulse laser light source, a relatively inexpensive laser diode, an LED, or the like. The irradiating excitation light L may be any of pulse light or continuous light and may be adjusted as appropriate in accordance with the purpose. The light source 7 can be any light source that emits the excitation light L from the second surface 24 side of the transparent substrate 21 via the lens 3 of the photocathode kit 1. In the example illustrated in FIG. 8, although the light source 7 is arranged outside the vacuum chamber 9, the light source 7 may be arranged inside the vacuum chamber 9.

In the example illustrated in FIG. 8, the photocathode kit 1 and the anode 8 are arranged inside the vacuum chamber 9. The photocathode 2 emits the electron beam B in response to receiving the excitation light L emitted from the light source 7. More specifically, electrons in the photocathode 2 are excited by the excitation light L, and the excited electrons are emitted from the photocathode 2. The emitted electrons form the electron beam B by an electric field formed by the anode 8 and the cathode 2. Note that, with respect to usage of the terms "photocathode" and "cathode" in this specification, the term "photocathode" may be used when emission of an electron beam is meant, and the term "cathode" may be used when a counter electrode of "anode" is meant, however, the reference "2" is used for both the cases of "photocathode" and "cathode".

The anode 8 is not particularly limited as long as it can form an electric field with the cathode 2, and an anode commonly used in the field of electron guns can be used.

There is no particular restriction on the arrangement of a power supply as long as the electron beam B can be emitted from the cathode 2 to the anode 8. In the example illustrated in FIG. 8, the power supply is arranged so that a potential difference is generated between the cathode 2 and the anode 8, and thereby, an electric field can be formed.

In the first embodiment of the electron gun 6, EA surface treatment on the deteriorated photocathode 2 can be performed inside the vacuum chamber 9. The housing container 10 in which the photocathode kit 1 is accommodated is a container that can vaporize the surface treatment material 10m arranged therein and is used for performing EA surface treatment on the photocathode 2 with the vaporized surface treatment material. The housing container 10 at least includes the electron beam passage hole 10h through which electrons emitted from the photocathode 2 passes. The electron beam passage hole 10h needs to have a size that enables passage of at least an electron and may be a size of 1 nm to 10 mm or may be a size of 50 μm to 5 mm in order to facilitate fabrication and adjustment of the angle or the positional relationship between the electron emitted from the photocathode 2 and the electron beam passage hole 10h.

There is no particular restriction on the material of the housing container 10, and the housing container 10 can be formed of a heat resistant material that can withstand heat of 300 degrees Celsius or higher, more preferably 400 degrees Celsius or higher, such as glass, molybdenum, ceramic, sapphire, titanium, tungsten, tantalum, or the like, for example.

The surface treatment material 10m arranged inside the housing container 10 is not particularly limited as long as it is a material that enables EA surface treatment. The element forming the surface treatment material 10m may be, for example, Li, Na, K, Rb, Cs, Te, Sb, or the like. Note that Li, Na, K, Rb, and Cs out of the above elements will spontaneously ignite by itself and are unable to be stored and utilized. Thus, Li, Na, K, Rb, and Cs are required to be used in a form of a composite element of the above element or a compound containing the above element. On the other hand, when the element is used in a form of a compound, it is required to prevent an impurity gas from emitting during deposition of the element. Therefore, when the element selected from Li, Na, K, Rb, and Cs is used as the surface treatment material 10m, it is preferable to combine and use a compound such as $Cs_2CrO_4$, $Rb_2CrO_4$, $Na_2CrO_4$, or $K_2CrO_4$ and a reducing agent that suppresses emission of an impurity gas. The surface treatment material 10m is vaporized inside the photocathode housing container 10 by using a heating device and deposited on the photocathode 2.

In the first embodiment of the electron gun 6, EA surface treatment is performed by moving the photocathode kit 1 to a deposition position inside the housing container 10 through a drive device 11 as illustrated in FIG. 9 as an example and vaporizing and depositing the surface treatment material 10m on the photocathode 2. The drive device 11 is not particularly limited as long as it can move the photocathode kit 1, and the drive device disclosed by International Publication No. 2015/008561 and International Publication No. 2018/186294 can be used, for example. The features disclosed in International Publication No. 2015/008561 and International Publication No. 2018/186294 are included in this specification.

The electron gun 6 in the first embodiment synergistically achieves the following advantageous effects in addition to the advantageous effects achieved by the photocathode kit 1 according to the first to sixth embodiments.

If EA surface treatment is performed in a state where a photocathode and a lens are exposed in a vacuum chamber (in a housing container), respectively, the surface treatment material 10m that has drifted around the end of the transparent substrate 21 may deposit on the lens 3. In such a case, the surface treatment material 10m attached to the lens 3 intervenes in the optical system, and the position at which the excitation light is focused may change. On the other hand, in the example illustrated in FIG. 8 and FIG. 9, the lens 3 is held in the holder 4 of the photocathode kit 1, the electron gun 6 is in a state of being sucked by a vacuum pump (not illustrated), and thus, the vaporized surface treatment material 10m does not enter the inside of the holder 4 during EA surface treatment on the photocathode 2. That is, this achieves an advantageous effect that the lens 3 is prevented from being contaminated with the surface treatment material 10m to keep the lens 3 clean.

In FIG. 9, the example using the photocathode kit 1F of the sixth embodiment is illustrated as the photocathode kit 1. In the example illustrated in FIG. 9, since the photocathode kit 1F has the vapor-inflow prevention part 49, the vaporized surface treatment material 10m is less likely to deposit on the upper surface of the lens 3. Note that, in the example illustrated in FIG. 9, a gap is present between the upper end of the vapor-inflow prevention part 49 and the light source 7 when the photocathode kit 1F has been moved to the deposition position. If necessary, the vapor-inflow prevention part 49 may be designed such that the height thereof is adjusted and the gap is eliminated between the upper end of the vapor-inflow prevention part 49 and the light source 7 when the photocathode kit 1F has been moved to the deposition position. In such a case, a risk of deposition of the vaporized surface treatment material 10m on the top surface of the lens 3 is further reduced. Further, although the drive device 11 is attached to the side face of the photocathode kit 1F in the example illustrated in FIG. 9, alternatively, the drive device 11 may be attached to the vapor-inflow prevention part 49 to drive the photocathode kit 1F.

The electron beam applicator E equipped with the electron gun may be a known device equipped with an electron gun. For example, the electron beam applicator E may be a free electron laser accelerator, an electron microscope, an electron holography device, an electron beam drawing device, an electron diffractometer, an electron beam inspection device, an electron beam metal additive manufacturing device, an electron beam lithography device, an electron beam processing device, an electron beam curing device, an electron beam sterilization device, an electron beam disinfection device, a plasma generation device, an atomic element generation device, a spin-polarized electron beam generation device, a cathodoluminescence device, an inverse photoemission spectroscopy device, or the like.

The present invention is not limited to the respective embodiments described above, and it is clear that each embodiment may be modified or changed as appropriate within the scope of the technical concept of the present invention. Further, any component used in each embodiment can be combined to another embodiment, and any component can be omitted in each embodiment.

INDUSTRIAL APPLICABILITY

With the use of the photocathode kit, the electron gun, and the electron beam applicator disclosed in the present application, the focal point of the lens is always set on the photocathode film by the holder of the photocathode kit. Therefore, the photocathode kit, the electron gun, and the electron beam applicator disclosed in the present application are useful for business entities that handle an electron gun.

LIST OF REFERENCES 1 photocathode kit
2 photocathode
21 transparent substrate
22 photocathode film
23 first surface
24 second surface
3 lens
31 lens pressing member
32 fixing part
4 holder
4a holder first member
4b holder second member
41 substrate holding part
42 spacer
43 one end
44 the other end
45 gas vent (first communication path)
46 second communication path
46a hole
46b recess
46c gap
47 lens holding part
48 substrate holding member
49 vapor-inflow prevention part
5 heater
51 heater insertion space
52 second gas vent
6 electron gun
7 light source
8 anode
9 vacuum chamber
10 housing container
10h electron beam passage hole
10m surface treatment material
11 drive device
B electron beam
E counterpart device
L excitation light

What is claimed is:

1. A photocathode kit comprising:
a photocathode including a substrate on which a photocathode film is formed on a first surface;
a lens which converges excitation light; and
a holder that holds the substrate and the lens,
wherein the holder has
a hollow structure,
a retaining member that retains the photocathode film and the lens to be spaced apart by a predetermined distance, and
a gas vent which is a through hole communicating between inside and outside of the holder to prevent expansion of gas inside the holder in vacuum,
wherein the lens is held in the hollow structure.

2. The photocathode kit according to claim 1,
wherein the retaining member is an internally hollowed spacer, and
wherein the spacer
is arranged inside of the hollow structure of the holder,
has one end contacting with the lens,
has the other end contacting with a second surface, which is the opposite side of the first surface, of the substrate, and has a second gas vent that communicates between inside of the spacer and inside of the holder such that the inside of the spacer does not become airtight.

3. The photocathode kit according to claim 2, wherein the spacer has a hole, and wherein the second gas vent is the hole.

4. The photocathode kit according to claim 3, wherein the holder further comprises a heater to heat the photocathode, wherein the heater is arranged in a heater insertion space provided in the holder.

5. An electron gun comprising:
the photocathode kit according to claim 4;
a housing container configured to accommodate the photocathode kit;
a light source configured to irradiate the photocathode with excitation light via the lens of the photocathode kit;
an anode that forms an electric field with the cathode to form an electron beam; and
a vacuum chamber,
wherein the photocathode kit, the housing container and the anode are arranged inside the vacuum chamber.

6. An electron gun comprising:
the photocathode kit according to claim 3;
a housing container configured to accommodate the photocathode kit;
a light source configured to irradiate the photocathode with excitation light via the lens of the photocathode kit;
an anode that forms an electric field with the cathode to form an electron beam; and
a vacuum chamber,
wherein the photocathode kit, the housing container and the anode are arranged inside the vacuum chamber.

7. The photocathode kit according to claim 2, wherein a recess formed in the one end contacting with the lens and/or the other end contacting with the second surface, which is the opposite side of the first surface, of the substrate is provided, and
wherein the second gas vent is the recess.

8. The photocathode kit according to claim 7, wherein the holder further comprises a heater to heat the photocathode, wherein the heater is arranged in a heater insertion space provided in the holder.

9. An electron gun comprising:
the photocathode kit according to claim 7;
a housing container configured to accommodate the photocathode kit;
a light source configured to irradiate the photocathode with excitation light via the lens of the photocathode kit;
an anode that forms an electric field with the cathode to form an electron beam; and
a vacuum chamber,
wherein the photocathode kit, the housing container and the anode are arranged inside the vacuum chamber.

10. The photocathode kit according to claim 2, wherein the holder further comprises a heater to heat the photocathode, wherein the heater is arranged in a heater insertion space provided in the holder.

11. An electron gun comprising:
the photocathode kit according to claim 10;
a housing container configured to accommodate the photocathode kit;
a light source configured to irradiate the photocathode with excitation light via the lens of the photocathode kit;
an anode that forms an electric field with the cathode to form an electron beam; and
a vacuum chamber,
wherein the photocathode kit, the housing container and the anode are arranged inside the vacuum chamber.

12. An electron gun comprising:
the photocathode kit according to claim 2;
a housing container configured to accommodate the photocathode kit;
a light source configured to irradiate the photocathode with excitation light via the lens of the photocathode kit;
an anode that forms an electric field with the cathode to form an electron beam; and
a vacuum chamber,
wherein the photocathode kit, the housing container and the anode are arranged inside the vacuum chamber.

13. The photocathode kit according to claim 1, wherein the retaining member has
a lens holding part, and
a substrate holding part.

14. The photocathode kit according to claim 13, wherein the holder further comprises a heater to heat the photocathode,
wherein the heater is arranged in a heater insertion space provided in the holder.

15. An electron gun comprising:
the photocathode kit according to claim 13;
a housing container configured to accommodate the photocathode kit;
a light source configured to irradiate the photocathode with excitation light via the lens of the photocathode kit;
an anode that forms an electric field with the cathode to form an electron beam; and
a vacuum chamber,
wherein the photocathode kit, the housing container and the anode are arranged inside the vacuum chamber.

16. The photocathode kit according to claim 1, wherein the holder further comprises a heater to heat the photocathode,
wherein the heater is arranged in a heater insertion space provided in the holder.

17. An electron gun comprising:
the photocathode kit according to claim 16;
a housing container configured to accommodate the photocathode kit;
a light source configured to irradiate the photocathode with excitation light via the lens of the photocathode kit;
an anode that forms an electric field with the cathode to form an electron beam; and
a vacuum chamber,
wherein the photocathode kit, the housing container and the anode are arranged inside the vacuum chamber.

18. An electron gun comprising:
the photocathode kit according to claim 1
a housing container configured to accommodate the photocathode kit;
a light source configured to irradiate the photocathode with excitation light via the lens of the photocathode kit;
an anode that forms an electric field with the cathode to form an electron beam; and a vacuum chamber,
wherein the photocathode kit, the housing container and the anode are arranged inside the vacuum chamber.

19. The electron gun according to claim 18 further comprising a surface treatment material arranged inside the housing container and used for performing surface treatment on the photocathode.

20. An electron beam applicator comprising the electron gun according to claim 18, wherein the electron beam applicator is
a free electron laser accelerator,
an electron microscope,
an electron holography device,
an electron beam drawing device,
an electron diffractometer,
an electron beam inspection device,
an electron beam metal additive manufacturing device,
an electron beam lithography device,
an electron beam processing device,
an electron beam curing device,
an electron beam sterilization device,
an electron beam disinfection device,
a plasma generation device,
an atomic element generation device,
a spin-polarized electron beam generation device,
a cathodoluminescence device, or
an inverse photoemission spectroscopy device.

\* \* \* \* \*